(12) United States Patent
Kajiura

(10) Patent No.: US 8,120,914 B2
(45) Date of Patent: Feb. 21, 2012

(54) SEMICONDUCTOR COOLING APPARATUS

(75) Inventor: Katsuyuki Kajiura, Kariya (JP)

(73) Assignee: Kabushiki Kaisha Toyota Jidoshokki, Aichi-Ken (JP)

(*) Notice: Subject to any disclaimer, the term of this patent is extended or adjusted under 35 U.S.C. 154(b) by 310 days.

(21) Appl. No.: 12/257,857

(22) Filed: Oct. 24, 2008

(65) Prior Publication Data

US 2009/0107655 A1    Apr. 30, 2009

(30) Foreign Application Priority Data

Oct. 25, 2007  (JP) ................................ 2007-277813

(51) Int. Cl.
*H05K 7/20*    (2006.01)

(52) U.S. Cl. .................. 361/699; 361/679.53; 361/689; 361/701; 165/80.4; 165/104.33

(58) Field of Classification Search ............ 361/679.46, 361/679.53, 605–642, 688, 689, 699, 704–712, 361/718–724, 763, 766, 775, 782, 793, 794, 361/818; 165/80.3, 80.4, 80.5, 104.33, 104.34, 165/166, 167, 177, 185; 257/706–727; 174/16.3, 174/252, 38; 363/56.02, 141, 144–147, 137; 307/9.1, 10.1, 11, 38, 115; 62/228.1, 259.2; 29/417, 602.1, 592.1, 740, 741, 759, 832, 29/831, 840, 842

See application file for complete search history.

(56) References Cited

U.S. PATENT DOCUMENTS

| | | | | |
|---|---|---|---|---|
| 3,327,776 A | * | 6/1967 | Butt | 165/80.4 |
| 4,420,739 A | * | 12/1983 | Herren | 338/53 |
| 5,526,231 A | * | 6/1996 | Arz et al. | 361/707 |

(Continued)

FOREIGN PATENT DOCUMENTS

JP    3010080 U    4/1995

(Continued)

OTHER PUBLICATIONS

Japanese Office Action, application No. 2007-277813, dated Apr. 19, 2011.

(Continued)

*Primary Examiner* — Michail V Datskovskiy

(74) *Attorney, Agent, or Firm* — Locke Lord LLP

(57) ABSTRACT

A semiconductor cooling apparatus having a tank forming body and semiconductor power device mounting substrates is disclosed. The tank forming body includes a first outer plate, a second outer plate, a middle plate, a first inner fin, and a second inner fin. The middle plate is brazed to the outer periphery of the first outer plate and the outer periphery of the second outer plate. The first inner fin is brazed to the first outer plate. A first cooling medium passage is defined between the first outer plate and the first inner fin. A second cooling medium passage is defined between the first inner fin and the middle plate. The second inner fin is brazed to the second outer plate. A third cooling medium passage is defined between the second inner fin and the middle plate. A fourth cooling medium passage is defined between the second outer plate and the second inner fin. The middle plate has a plurality of through holes through which a second cooling medium passage and a third cooling medium passage communicate with each other. Each one of the mounting substrates includes a first surface on which a semiconductor power device is mounted and a second surface brazed to one of the first outer plate and the second outer plate.

4 Claims, 9 Drawing Sheets

U.S. PATENT DOCUMENTS

| | | | |
|---|---|---|---|
| 5,713,413 A * | 2/1998 | Osakabe et al. | 165/104.33 |
| 6,305,463 B1 * | 10/2001 | Salmonson | 165/80.3 |
| 6,442,023 B2 * | 8/2002 | Cettour-Rose et al. | 361/690 |
| 6,508,301 B2 * | 1/2003 | Marsala | 165/80.4 |
| 6,653,709 B2 * | 11/2003 | Wu et al. | 257/499 |
| 6,690,087 B2 * | 2/2004 | Kobayashi et al. | 257/686 |
| 6,799,628 B1 * | 10/2004 | Masseth et al. | 165/80.4 |
| 7,090,044 B2 * | 8/2006 | Nakamura et al. | 180/65.8 |
| 7,200,007 B2 * | 4/2007 | Yasui et al. | 361/716 |
| 7,231,960 B2 * | 6/2007 | Sakai | 165/76 |
| 7,571,759 B2 * | 8/2009 | Inagaki et al. | 165/80.4 |
| 7,835,151 B2 * | 11/2010 | Olesen | 361/689 |
| 2006/0219396 A1 | 10/2006 | Abei et al. | |
| 2007/0039717 A1 * | 2/2007 | Inagaki et al. | 165/80.4 |
| 2007/0085197 A1 * | 4/2007 | Arai et al. | 257/712 |
| 2008/0239671 A1 * | 10/2008 | Amano et al. | 361/699 |
| 2009/0080159 A1 * | 3/2009 | Ippoushi et al. | 361/701 |

FOREIGN PATENT DOCUMENTS

| | | |
|---|---|---|
| JP | 08-78585 A | 3/1996 |
| JP | 08-136168 A | 5/1996 |
| JP | 2006-287108 A | 10/2006 |
| JP | 2007-173372 | 7/2007 |

OTHER PUBLICATIONS

Japanese Office Action for Application No. 2007-277813, dated Oct. 4, 2011.

* cited by examiner

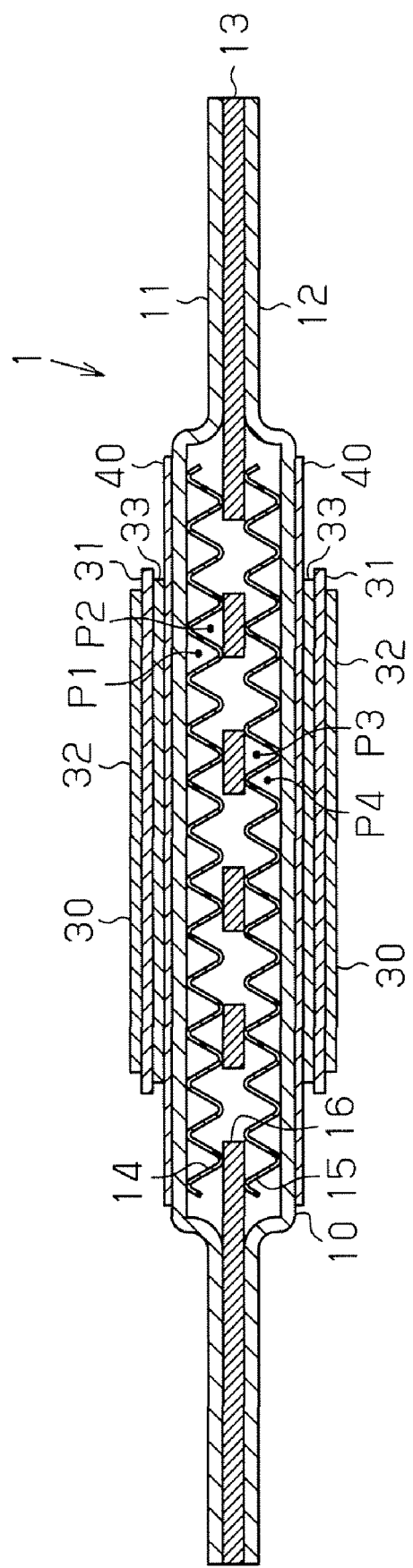

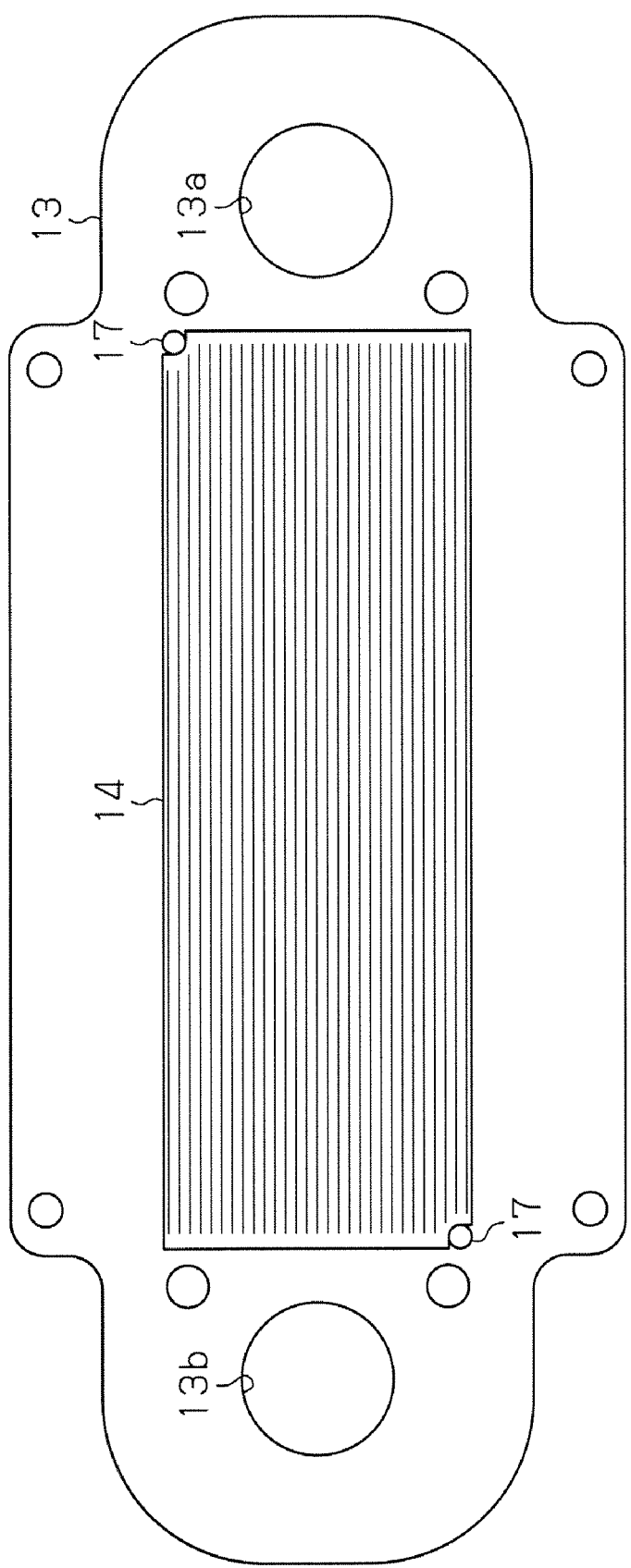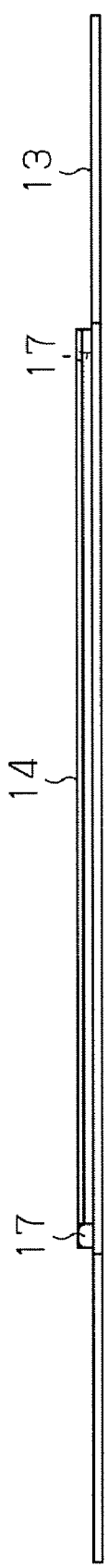

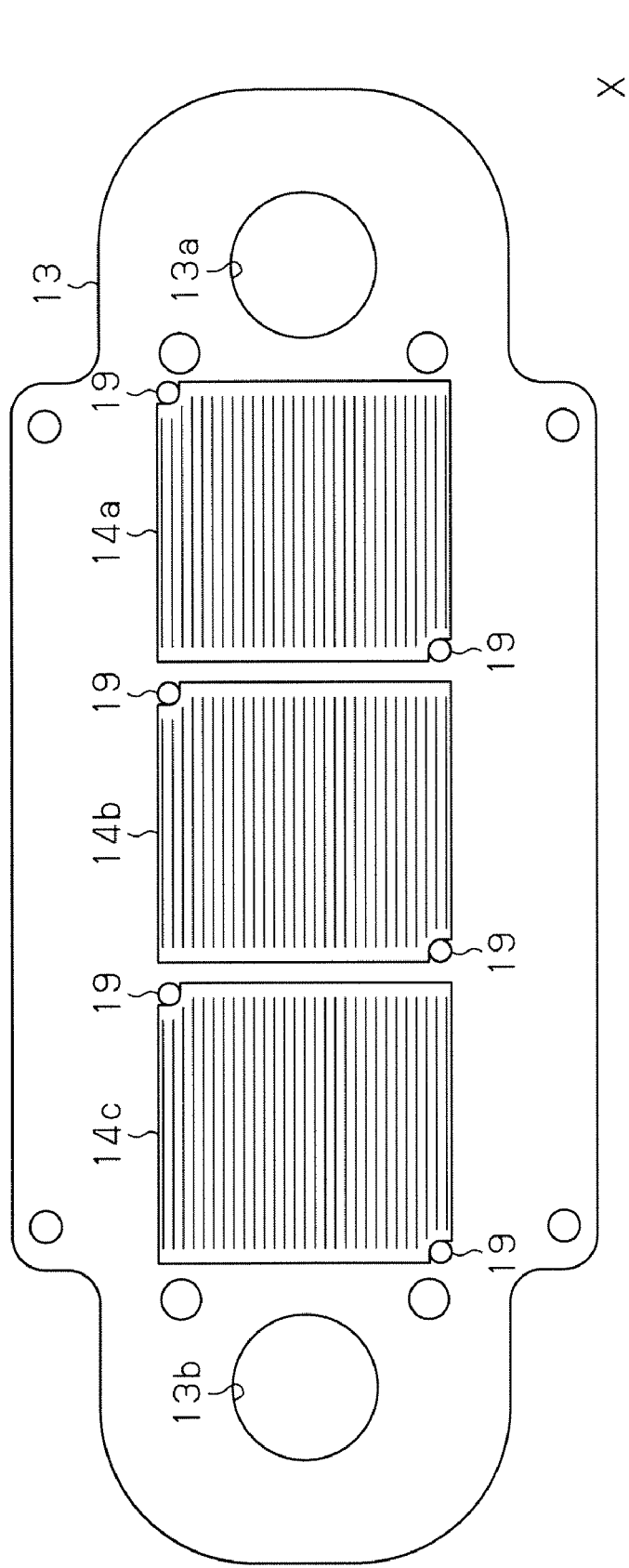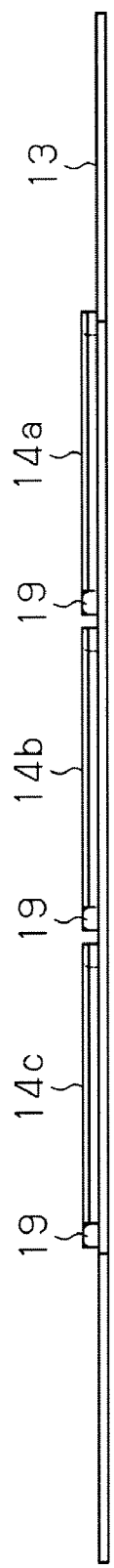

SEMICONDUCTOR COOLING APPARATUS

BACKGROUND OF THE INVENTION

The present invention relates to a semiconductor cooling apparatus, and, more particularly, a cooling apparatus that releases heat produced through operation of a semiconductor power device.

A cooling apparatus having inner fins arranged in a cooling tube is disclosed in, for example, Japanese Laid-Open Patent Publication No. 2007-173372.

As shown in FIG. 9, the cooling apparatus of the aforementioned publication includes a pair of cooling tubes 110. Each cooling tube 110 is joined with a corresponding one of opposite surfaces of a modularized semiconductor power device 100 through an associated insulating material 101. The configuration of each cooling tube 110 is as follows. Specifically, the cooling tube 110 has a pair of outer plates 111 and a middle plate 112 arranged between the outer plates 111. The middle plate 112 is joined to the outer edges of the outer plates 111. The space defined by the outer plates 111 and the middle plate 112 is a cooling medium passage. An inner fin 113 is provided between each outer plate 111 and the middle plate 112. The cooling medium passage is divided into a plurality of lines by the inner fin 113.

The cooling tubes 110 and the modularized power device 100 are joined together through the insulating material 101. This makes it impossible to braze the cooling tubes 110 to the modularized power device 100. In other words, the cooling apparatus may be improved so as to facilitate the assembly of the components of the apparatus. Also, there is a demand for an improved cooling efficiency of the cooling tubes 110.

SUMMARY OF THE INVENTION

Accordingly, it is an objective of the present invention to provide an easy-to-assemble semiconductor cooling apparatus with an improved cooling efficiency.

To achieve the foregoing objective and in accordance with one aspect of the present invention, a semiconductor cooling apparatus including a tank forming body and semiconductor power device mounting substrates is provided. The tank forming body includes a first outer plate, a second outer plate, a middle plate, a first inner fine with a corrugated plate-like shape, and a second inner fin with a corrugated plate-like shape. The middle plate is arranged between the first outer plate and the second outer plate. An outer periphery of the first outer plate and an outer periphery of the second outer plate are brazed to the middle plate. The first inner fin is arranged between the first outer plate and the middle plate. The first inner fin is brazed to at least one of the first outer plate and the middle plate. A first cooling medium passage is defined between the first outer plate and the first inner fin. A second cooling medium passage is defined between the first inner fin and the middle plate. The second inner fin is arranged between the second outer plate and the middle plate. The second inner fin is brazed to at least one of the second outer plate and the middle plate. A third cooling medium passage is defined between the second inner fin and the middle plate. A fourth cooling medium passage is defined between the second outer plate and the second inner fin. The middle plate has at least one through hole through which the second cooling medium passage and the third cooling medium passage communicate with each other. The semiconductor power device mounting substrates are each brazed to an outer surface of one of the first outer plate and the second outer plate. Each semiconductor power device mounting substrate has an insulating substrate and metal layers formed on both surfaces of the insulating substrate. Each semiconductor power device mounting substrate has a first surface on which a semiconductor power device is mounted and a second surface brazed to one of the first outer plate and the second outer plate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a cross-sectional view taken along line 5-5 of FIG. 3;

FIG. 6A is a plan view showing a middle plate and an inner fin of the semiconductor cooling apparatus illustrated in FIG. 1;

FIG. 6B is a front view showing the middle plate and the inner fin illustrated in FIG. 6A;

FIG. 8A is a plan view showing a middle plate and an inner fin of the semiconductor cooling apparatus illustrated in FIG. 7;

FIG. 8B is a front view showing the middle plate and the inner fin illustrated in FIG. 8A.

DETAILED DESCRIPTION OF THE PREFERRED EMBODIMENTS

One embodiment of the present invention will now be described with reference to the attached drawings.

A semiconductor cooling apparatus 1 of the present embodiment is used in an inverter of a motor mounted in a vehicle and cools an IGBT for the inverter and a flywheel diode, which are semiconductor power devices.

Figure 1:
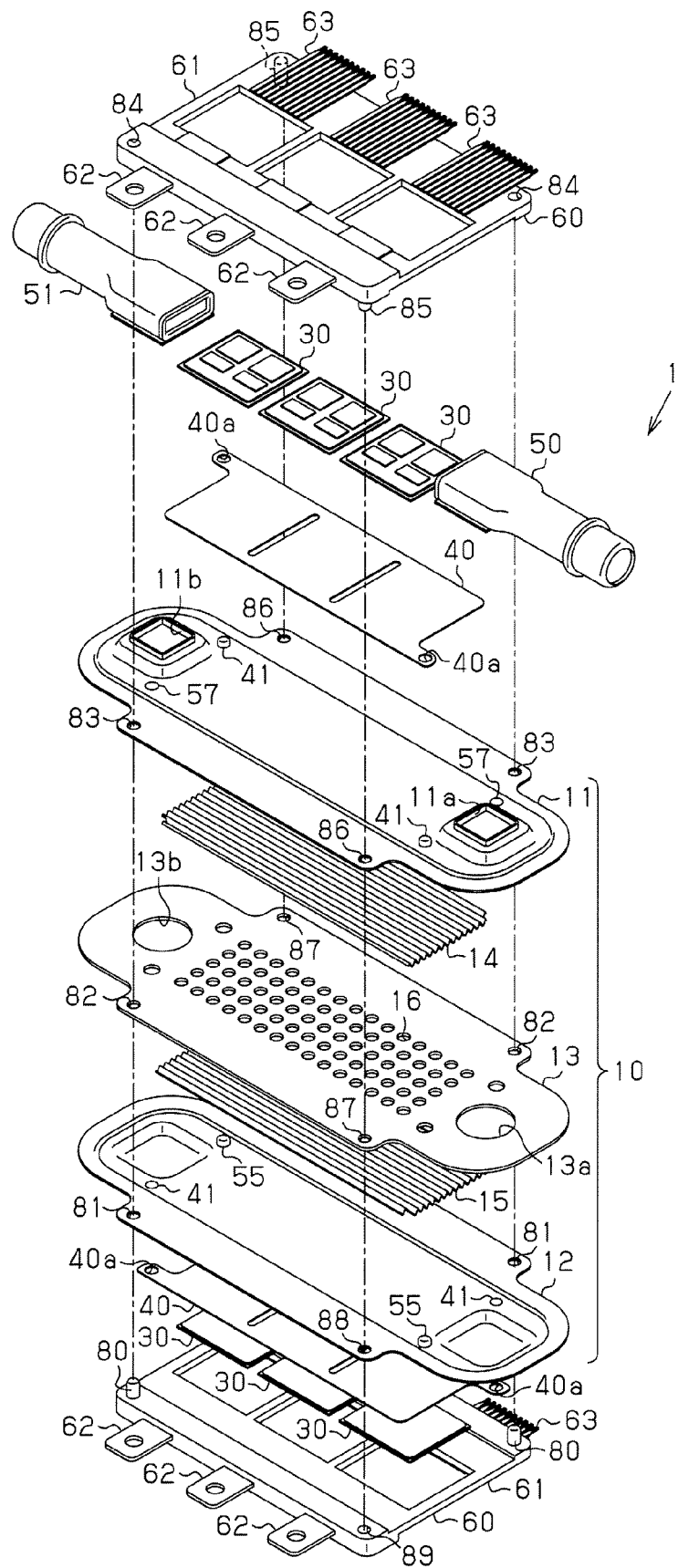
FIG. 1 is an exploded perspective view showing a semiconductor cooling apparatus according to one embodiment of the present invention.

As shown in FIG. 1, the semiconductor cooling apparatus 1 has a tank forming body 10 and a plurality of semiconductor power device mounting substrates 30, which are arranged at both surfaces of the tank forming body 10. In the present embodiment, six semiconductor power device mounting substrates 30 are provided.

Figure 2:
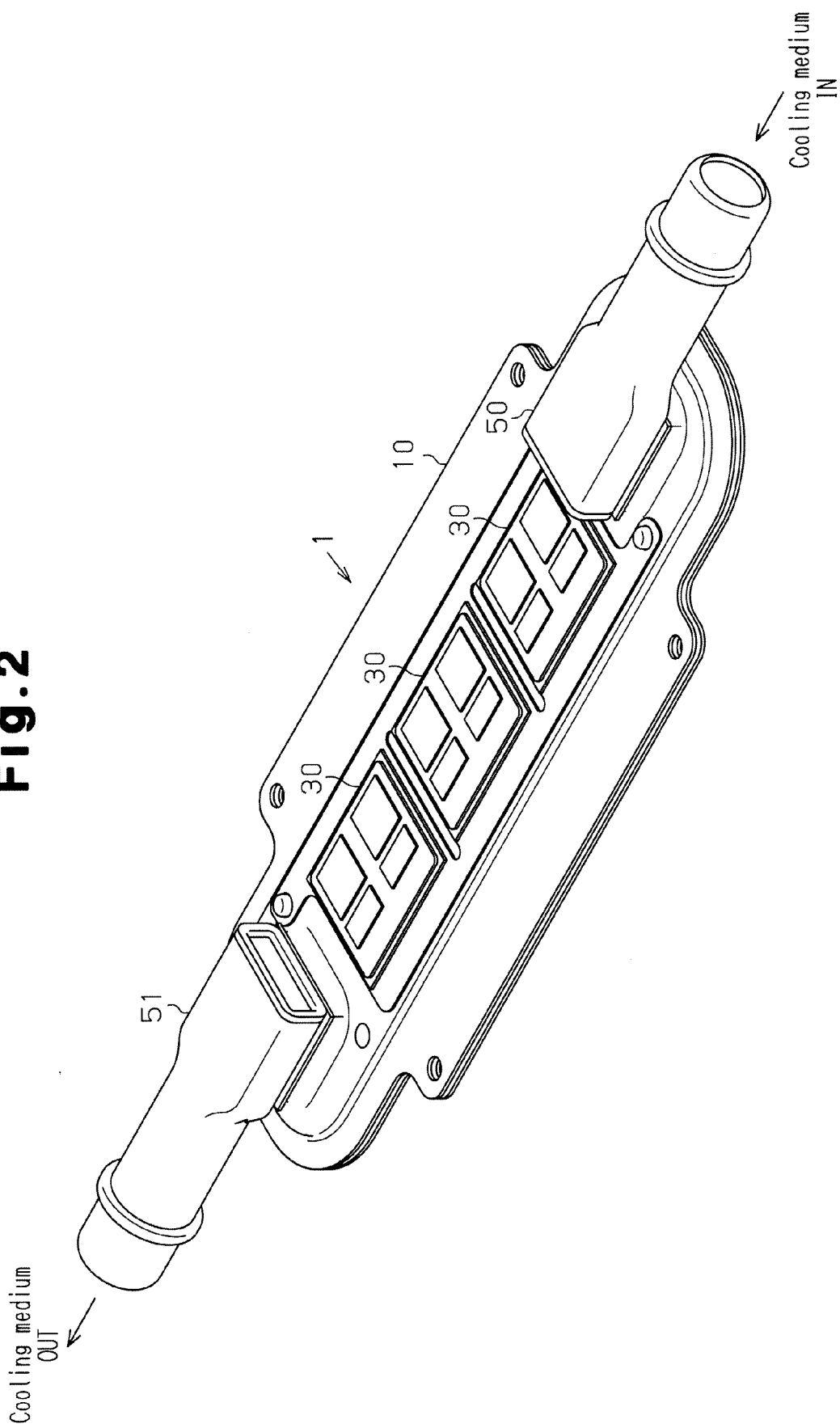
FIG. 2 is a perspective view showing the semiconductor cooling apparatus illustrated in FIG. 1.
Figure 3:
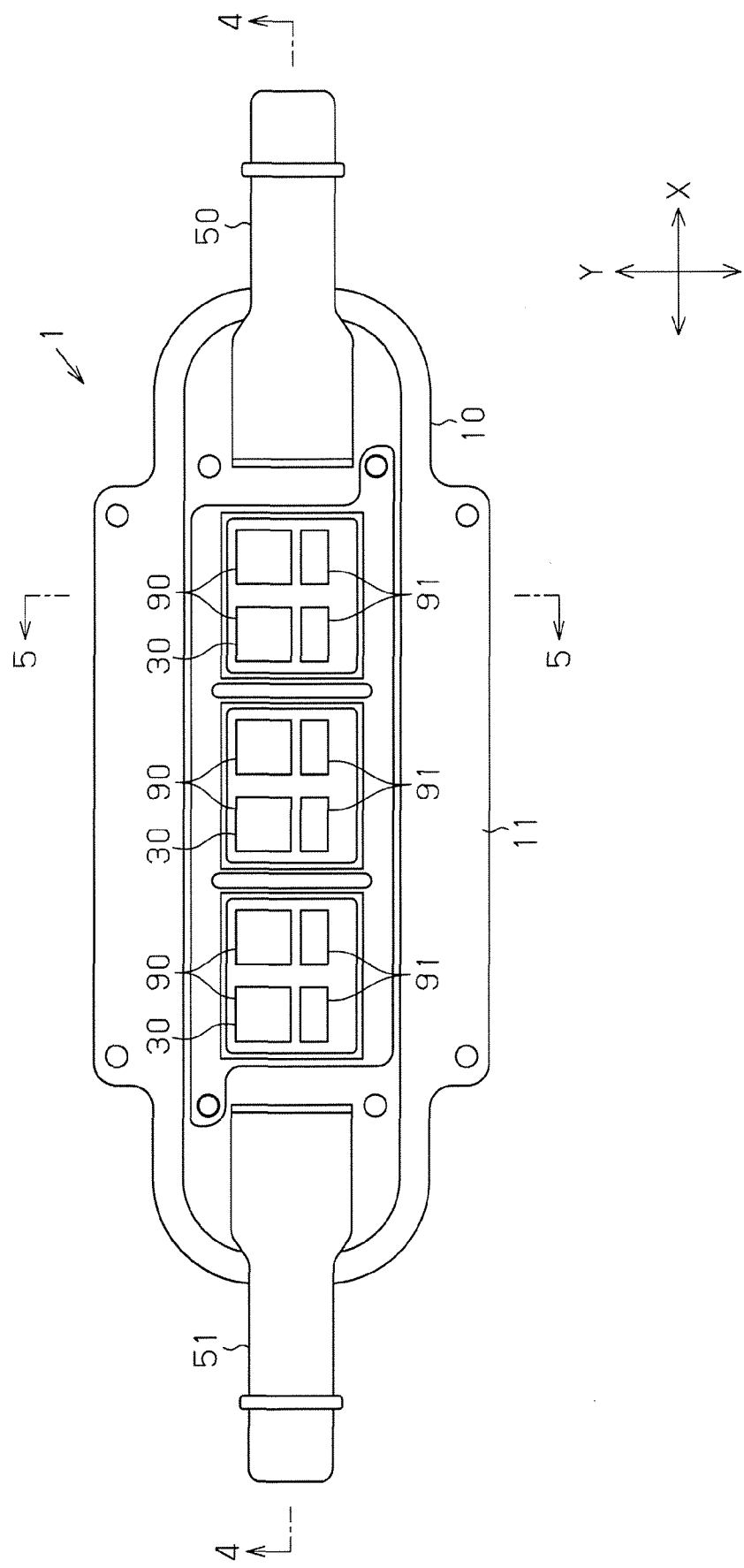
FIG. 3 is a plan view showing the semiconductor cooling apparatus illustrated in FIG. 1.
Figure 4:
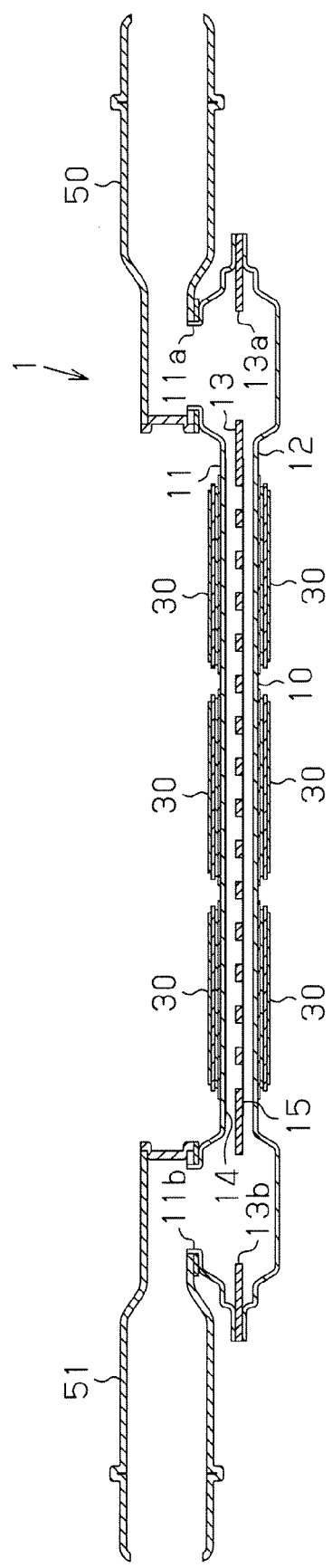
FIG. 4 is a cross-sectional view taken along line 4-4 of FIG. 3.

The tank forming body 10 has an oval shape extending in an X direction as viewed from above in FIG. 3, with a predetermined thickness as illustrated in FIG. 4. With reference to FIG. 2, coolant or alcohol serving as cooling medium is supplied into the tank forming body 10 from a longitudinal end of the tank forming body 10. The cooling medium flows through the tank forming body 10 in the longitudinal direction, or the X direction, and exits the tank forming body 10 from the other longitudinal end.

With reference to FIGS. 3, 4, and 5, the tank forming body 10 has a first outer plate 11, a second outer plate 12, and a middle plate 13. The middle plate 13 is arranged between the first outer plate 11 and the second outer plate 12. The middle plate 13 is joined to an outer periphery of the first outer plate 11 and an outer periphery of the second outer plate 12. Specifically, the outer peripheries of the first and second outer plates 11, 12 and the middle plate 13 are brazed together. This structure allows the cooling medium to flow through the space surrounded by the outer plates 11, 12.

As illustrated in FIG. 5, a first inner fin 14, which has a corrugated plate-like shape, is provided between the first outer plate 11 and the middle plate 13. The first inner fin 14 is brazed to the first outer plate 11. Similarly, a second inner fin 15, which has a corrugated plate-like shape, is arranged between the second outer plate 12 and the middle plate 13. The second inner fin 15 is brazed to the second outer plate 12. The first outer plate 11, the second outer plate 12, the middle plate 13, the first inner fin 14, and the second inner fin 15 are each formed of aluminum.

A first cooling medium passage P1 is defined between the first outer plate 11 and the first inner fin 14. A second cooling medium passage P2 is defined between the first inner fin 14 and the middle plate 13. A third cooling medium passage P3 is defined between the middle plate 13 and the second inner fin 15. A fourth cooling medium passage P4 is defined between the second inner fin 15 and the second outer plate 12.

With reference to FIG. 5, each one of the mounting substrates 30 includes an insulating substrate 31 and metal layers 32, 33. The metal layers 32, 33 are deposited on opposite surfaces of the insulating substrate 31. The insulating substrate 31 is formed of, for example, aluminum nitride (AlN) and the metal layers 32, 33 are each formed of aluminum or copper (Cu). As shown in FIG. 3, a first surface of the mounting substrate 30 is a mounting surface, on which semiconductor power devices (silicone tips) are mounted. Specifically, IGBTs 90 and diodes 91 are joined to the mounting surface through soldering. The semiconductor power devices mounted on the first surface of the mounting substrate 30 are electrically isolated from one another.

A second surface of each mounting substrate 30 is brazed to the tank forming body 10. Among the six mounting substrates 30, the second surfaces of three of the mounting substrates 30 are brazed to the outer surface (the upper surface), as viewed in FIG. 5, of the first outer plate 11 of the tank forming body 10 through a filler 40, which is an aluminum brazing filler. Similarly, the second surfaces of the remaining three of the mounting substrate 30 are brazed to the outer surface (the lower surface), as viewed in FIG. 5, of the second outer plate 12 of the tank forming body 10 through the filler 40. In other words, the fillers 40 are brazing fillers, with which the mounting substrates 30 are brazed to the outer plates 11, 12.

As shown in FIG. 1, a plurality of projections 41 project from each one of the outer plates 11, 12. Each one of the projections 41 is passed through a corresponding one of through holes 40a defined in the associated filler 40. This positions the fillers 40 with respect to the outer plates 11, 12. Each mounting substrate 30 and the corresponding filler 40 may be positioned with respect to each other in advance through adhesive or using a jig.

With reference to FIG. 1, a plurality of projections 55 projecting from the outer plate 12 position the inner fin 15 with respect to the outer plate 12. The projections 55 suppress displacement of the inner fin 15 with respect to the outer plate 12 in a longitudinal direction. Further, a plurality of projections 57 projecting from the outer plate 11 position the inner fin 14 with respect to the outer plate 11. The projections 57 suppress displacement of the inner fin 14 with respect to the outer plate 11 in a longitudinal direction. The projections 55, 57 may be replaced by a plurality of projections 17 projecting from the middle plate 13, which position the inner fins 14, 15, as illustrated in FIGS. 6A and 6B.

In this manner, with the middle plate 13 held between the first outer plate 11 and the second outer plate 12, the first and second outer plates 11, 12 are brazed to the middle plate 13 at the outer peripheries of the outer plates 11, 12. The first inner fin 14 is brazed to the inner surface of the first outer plate 11 and the second inner fin 15 is brazed to the inner surface of the second outer plate 12. The mounting substrates 30 are brazed to the outer surfaces of the corresponding outer plates 11, 12. That is, the components forming the semiconductor cooling apparatus 1 are bonded together simultaneously through brazing. This facilitates the assembly of the semiconductor cooling apparatus 1.

As shown in FIGS. 2 and 3, a pipe 50 and a pipe 51 are connected to the tank forming body 10. The pipe 50 sends cooling medium to the tank forming body 10 and the pipe 51 drains the cooling medium from the tank forming body 10. As viewed in FIG. 4, the pipe 50 is connected to the top surface of the right end of the tank forming body 10 and the pipe 51 is connected to the top surface of the left end of the tank forming body 10.

As illustrated in FIG. 1, a communication hole 11a and a communication hole 11b are each defined on the corresponding one of the two longitudinal ends of the first outer plate 11. The tank forming body 10 and the pipe 50 communicate with each other through the communication hole 11a and the tank forming body 10 and the pipe 51 communicate with each other through the communication hole 11b. A communication hole 13a and a communication hole 13b each extend through the corresponding one of the two longitudinal ends of the middle plate 13. The spaces at both sides of the middle plate 13 communicate with each other through the communication holes 13a, 13b. For example, water or alcohol serving as cooling medium is sent into the tank forming body 10 through the pipe 50 and then drained from the tank forming body 10 through the pipe 51. Specifically, the cooling medium enters the tank forming body 10 through the communication hole 11a and flows through the first and second cooling medium passages P1, P2, which are located above the middle plate 13, in the tank forming body 10. The cooling medium then passes through the communication hole 13a and flows into the third and fourth cooling medium passages P3, P4, which are located below the middle plate 13. Afterwards, the cooling medium flows through the communication hole 13b and is merged with the cooling medium that has passed through the first and second cooling medium passages P1, P2. The cooling medium is then drained from the pipe 51 through the communication hole 11b.

As illustrated in FIG. 3, the pipe 50 and the pipe 51 extend in the longitudinal direction of the tank forming body 10, or the X direction. Alternatively, the pipes 50, 51 may extend in a Y direction, or a direction perpendicular to the X direction.

With reference to FIG. 1, after the semiconductor power devices are soldered to the corresponding mounting substrates 30, a connector 60 is arranged on the mounting substrates 30. The connector 60 has a pair of resin casings 61 that are separable in a vertical direction. Each one of the casings 61 has a plurality of power terminals 62 and a plurality of signal terminals 63. The power terminals 62 and the signal terminals 63 are electrically connected to the semiconductor power devices (the IGBTs 90 and the diodes 91) through bonding wires.

As viewed in FIG. 1, a plurality of projections 80 project from the lower one of the resin casings 61. Each one of the projections 80 is passed through a corresponding one of through holes 81 of the outer plate 12, a corresponding one of through holes 82 of the middle plate 13, a corresponding one of through holes 83 of the outer plate 11, and a corresponding one of holes 84 of the upper resin casing 61. The second outer plate 12, the middle plate 13, the first outer plate 11, and the upper resin casing 61 are thus positioned with respect to the lower resin casing 61. Similarly, a plurality of projections 85 project from the upper resin casing 61. Each one of the projections 85 is passed through a corresponding one of through holes 86 of the outer plate 11, a corresponding one of through holes 87 of the middle plate 13, a corresponding one of through holes 88 of the outer plate 12, and a corresponding one of holes 89 of the lower resin casing 61. The first outer plate 11, the middle plate 13, the second outer plate 12, and the lower resin casing 61 are thus positioned with respect to the upper resin casing 61.

With reference to FIGS. 1 and 5, a plurality of through holes 16 extend through the middle plate 13. The through holes 16 each have a circular shape and are arranged in a grid-like manner. The through holes 16 allow the cooling medium to move between the second cooling medium passage P2 and the third cooling medium passage P3. In other words, the cooling medium is allowed to flow from the second cooling medium passage P2 to the third cooling medium passage P3 and from the third cooling medium passage P3 to the second cooling medium passage P2 through the through holes 16.

The heat generated by the semiconductor power devices on the mounting substrates 30 is transmitted to the first outer plate 11 or the second outer plate 12 through the corresponding mounting substrates 30. Then, heat exchange occurs between the first outer plate 11 and the cooling medium flowing in the first and second cooling medium passages P1, P2. Heat exchange occurs also between the second outer plate 12 and the cooling medium flowing in the third and fourth cooling medium passages P3, P4. The first inner fin 14 is provided between the first outer plate 11 and the middle plate 13, and the second inner fin 15 is arranged between the second outer plate 12 and the middle plate 13. Since the inner fins 14, 15 each have a corrugated shape, the heat radiating area of the inner fins 14, 15 is greater than the heat radiating area of an inner fin having a flat plate-like shape. In other words, the first and second inner fins 14, 15 substantially increase the heat radiating area of the semiconductor cooling apparatus 1, thus improving the cooling performance of the semiconductor cooling apparatus 1.

Figure 9:
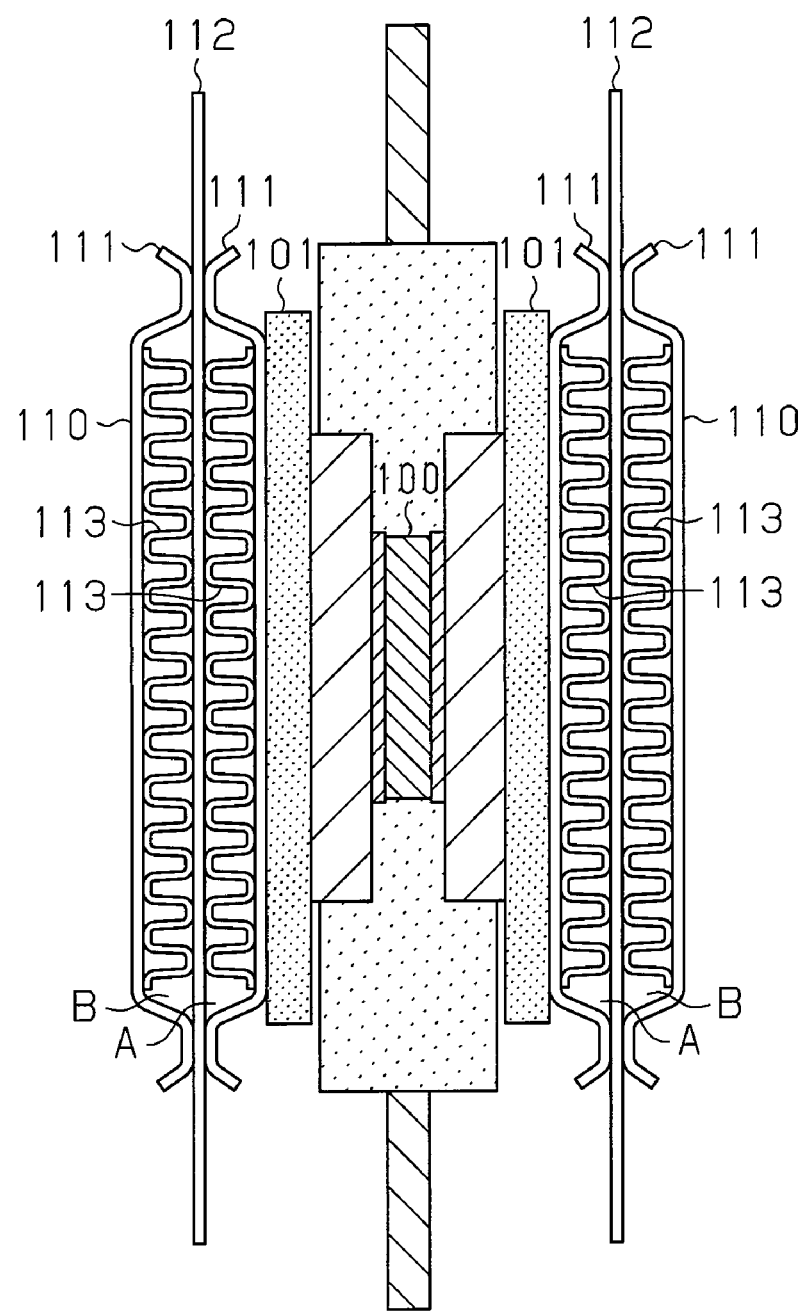
FIG. 9 is a cross-sectional view showing a conventional semiconductor cooling apparatus.

In the conventional semiconductor cooling apparatus illustrated in FIG. 9, a heat radiator plate and the insulating material 101 are arranged between the semiconductor power device 100, which is a heat radiating body, and each cooling tube 110 defining a coolant passage. Further, grease is applied to the contact surfaces of the components. In contrast, in the semiconductor cooling apparatus 1 of the present embodiment, the mounting substrates 30 are brazed directly to the corresponding outer plates 11, 12 without a heat radiator plate or grease being provided between the mounting substrates 30 and the outer plates 11, 12. As a result, the semiconductor power device is cooled efficiently.

In the semiconductor cooling apparatus of FIG. 9, the interior of each cooling tube 110 is divided into the two cooling medium passages A, B by the associated middle plate 112. Thus, a difference is likely to occur between the temperature of the coolant in the cooling medium passage A and the temperature of the coolant in the cooling medium passage B.

However, in the present embodiment, the second cooling medium passage P2 and the third cooling medium passage P3 communicate with each other through the through holes 16 extending through the middle plate 13. The cooling medium flowing in the second cooling medium passage P2 and the cooling medium flowing in the third cooling medium passage P3 are thus allowed to replace each other. This decreases the difference between the temperature of the cooling medium flowing in the second cooling medium passage P2 and the temperature of the cooling medium flowing in the third cooling medium passage P3. As a result, the semiconductor cooling apparatus 1 has an improved cooling efficiency.

The present embodiment has the following advantages.

The first outer plate 11 and the second outer plate 12 are brazed to the middle plate 13 at the outer peripheries of the outer plates 11, 12 with the middle plate 13 arranged between the first outer plate 11 and the second outer plate 12. The first inner fin 14 is brazed to the first outer plate 11, and the second inner fin 15 is brazed to the second outer plate 12. The mounting substrates 30 are brazed to the first and second outer plates 11, 12. The middle plate 13 has the multiple through holes 16, and the second cooling medium passage P2 and the third cooling medium passage P3 communicate with each other through the through holes 16. This structure facilitates the assembly of the semiconductor cooling apparatus 1 and also improves the cooling efficiency of the semiconductor cooling apparatus 1.

The present embodiment is not restricted to the above-described form but may be modified in, for example, the following forms.

Figure 7:
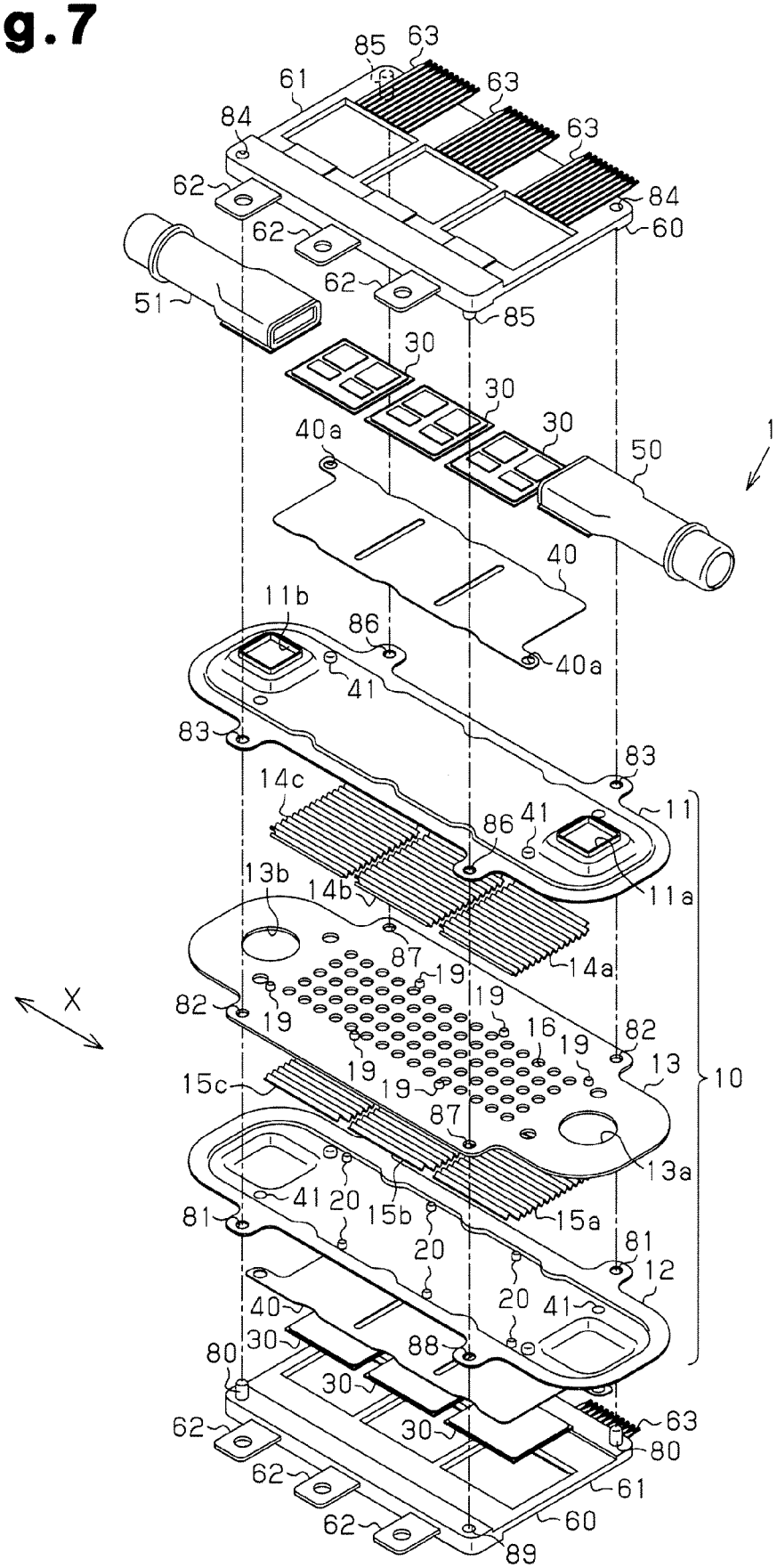
FIG. 7 is an exploded perspective view showing a semiconductor cooling apparatus of a modified embodiment.

Instead of providing the inner fins 14, 15 each as an integral component, each inner fin 14, 15 may be formed by a plurality of separate sections, as illustrated in FIG. 7, so as to facilitate movement of the cooling medium between the spaces at both sides of the inner fin 14, 15. In the example of FIG. 7, each inner fin 14, 15 is divided into three sections along the longitudinal direction of the tank forming body 10 (the X direction). Specifically, the first inner fin 14 includes three separate sections 14a, 14b, 14c and the second inner fin 15 has three separate sections 15a, 15b, 15c.

In this case, it is preferable to arrange a positioning member in at least one of the first outer plate 11 and the middle plate 13 so that the separate sections 14a to 14c are positioned. It is also preferable to arrange a positioning member in at least one of the second outer plate 12 and the middle plate 13 so that the separate sections 15a to 15c are positioned. For example, with reference to FIGS. 8A and 8B, three pairs of positioning projections 19 project from the middle plate 13. Each pair of the positioning projections 19 are engaged with a pair of corner portions located diagonally in the corresponding separate section 14a to 14c. Similarly, with reference to FIG. 7, three pairs of positioning projections 20 project from the second outer plate 12. Each pair of the positioning projections 20 are engaged with a pair of corners located diagonally in the corresponding separate section 15a to 15c.

The three separate sections 14a, 14b, 14c of the first inner fin 14 are spaced from one another in the longitudinal direction of the tank forming body 10. Similarly, the three separate sections 15a, 15b, 15c of the second inner fin 15 are spaced from one another in the longitudinal direction of the tank forming body 10. The first cooling medium passage P1 and the second cooling medium passage P2 are thus allowed to communicate with each other through the gap between each adjacent pair of the separate sections 14a to 14c. This decreases the difference between the temperature of the cooling medium flowing in the first cooling medium passage P1 and the temperature of the cooling medium flowing in the second cooling medium passage P2. Also, the third cooling medium passage P3 and the fourth cooling medium passage P4 are allowed to communicate with each other through the gap between each adjacent pair of the separate sections 15a to 15c. This reduces the difference between the temperature of the cooling medium flowing in the third cooling medium passage P3 and the temperature of the cooling medium flowing in the fourth cooling medium passage P4. In other words, efficient heat exchange is ensured between the cooling medium flowing in the cooling medium passage P1 and the cooling medium flowing in the cooling medium passage P2, as well as between the cooling medium flowing in the cooling medium passage P3 and the cooling medium flowing in the cooling medium passage P4. As a result, the cooling efficiency of the semiconductor cooling apparatus 1 is further improved.

The tank forming body 10 has the positioning projections 19 engaged with the separate sections 14a, 14b, 14c and the positioning projections 20 engaged with the separate sections 15a, 15b, 15c. The separate sections 14a to 14c and the separate sections 15a to 15c are thus positioned easily and reliably.

The first inner fin 14 may be brazed to the middle plate 13, instead of the first outer plate 11. The first inner fin 14 may be brazed to either the middle plate 13 or the first outer plate 11 as long as the first inner fin 14 is brazed to one of the middle plate 13 and the first outer plate 11. Similarly, the second inner fin 15 may be brazed to the middle plate 13, instead of the second outer plate 12. The second inner fin 15 may be brazed to either the second outer plate 12 or the middle plate 13 as long as the second inner fin 15 is brazed to one of the second outer plate 12 and the middle plate 13.

What is claimed is:

1. A semiconductor cooling apparatus comprising:
   a tank forming body, the tank forming body including:
      a first outer plate;
      a second outer plate;
      a middle plate arranged between the first outer plate and the second outer plate, and outer periphery of the first outer plate and an outer periphery of the second outer plate being brazed to the middle plate;
      a first inner fin with a corrugated plate-like shape arranged between the first outer plate and the middle plate, the first inner fin being brazed to at least one of the first outer plate and the middle plate, a first cooling medium passage being defined between the first outer plate and the first inner fin, a second cooling medium passage being defined between the first inner fin and the middle plate; and
      a second inner fin with a corrugated plate-like shape arranged between the second outer plate and the middle plate, the second inner fin being brazed to at least one of the second outer plate and the middle plate, a third cooling medium passage being defined between the second inner fin and the middle plate, a fourth cooling medium passage defined between the second outer plate and the second inner fin, the middle plate having at least one through hole through which the second cooling medium passage and the third cooling medium passage communicate with each other; and
   semiconductor power device mounting substrates each brazed to an outer surface of one of the first outer plate and the second outer plate, each semiconductor power device mounting substrate having an insulating substrate and metal layers formed on both surfaces of the insulating substrate, each semiconductor power device mounting substrate having a first surface on which a semiconductor power device is mounted and a second surface brazed to one of the first outer plate and the second outer plate,
   wherein the first inner fin and the second inner fin each include a plurality of separate sections that are arranged to be mutually spaced.

2. The apparatus according to claim 1, wherein the tank forming body includes a positioning member that positions the separate sections.

3. The apparatus according to claim 2, wherein the positioning member includes a pair of projections engageable with two corner portions that are located diagonally in each of the separate sections.

4. The apparatus according to claim 1, wherein the middle plate includes a pair of communication holes through which a space including the first cooling medium passage and the second cooling medium passage and a space including the third cooling medium passage and the fourth cooling medium passage communicate with each other.

* * * * *